United States Patent [19]

Nagashima

[11] Patent Number: 4,584,444
[45] Date of Patent: Apr. 22, 1986

[54] KEYBOARD SWITCH

[75] Inventor: Takao Nagashima, Tokyo, Japan

[73] Assignee: Topre Corporation, Tokyo, Japan

[21] Appl. No.: 652,738

[22] Filed: Sep. 21, 1984

[51] Int. Cl.[4] .......................... H01G 5/01; H01H 9/00
[52] U.S. Cl. ............................. 200/52 R; 200/DIG. 1;
200/159 B; 361/288
[58] Field of Search .............. 200/5 A, DIG. 1, 52 R,
200/159 R, 307, 276, 301.2; 361/288; 340/365
C; 400/479.1; 116/279, DIG. 1

[56] References Cited

U.S. PATENT DOCUMENTS

| Re. 30,435 | 11/1980 | Fukao | 200/307 X |
|---|---|---|---|
| 3,842,230 | 10/1974 | Kashio et al. | 200/276 |
| 3,932,722 | 1/1976 | Obata et al. | 260/159 B X |
| 3,965,399 | 6/1976 | Walker, Jr. et al. | 361/288 |
| 4,046,975 | 9/1977 | Seeger, Jr. | 200/5 A |
| 4,453,061 | 6/1984 | Tamura | 200/159 B X |
| 4,458,293 | 7/1984 | Cherry | 361/288 |
| 4,482,932 | 11/1984 | Hasegawa | 361/288 |

FOREIGN PATENT DOCUMENTS 654950  3/1979  U.S.S.R. ............... 361/288

OTHER PUBLICATIONS

IBM Tech. Disc. Bulletin; Harris, R. H.; "Conical Return and Capacitive Coupling Spring Keyboard Switch", vol. 24; No. 8; Jan. 1982; pp. 4014, 4015.

*Primary Examiner*—J. R. Scott
*Attorney, Agent, or Firm*—Oblon, Fisher, Spivak, McClelland & Maier

[57] ABSTRACT

A keyboard switch is provided with an insulating substrate, a first electrode laid on the insulating substrate, a second electrode formed of a conical coil spring and facing the first electrode, a dielectric disposed on the first electrode, a button positioned on the top portion of the second electrode, and a rubber cap disposed between the button and second electrode, for giving snap feeling to an operator when the button is depressed and the capacitance of the switch exceeds a given value. The capacitance varies with the change in the facing area which changes substantially in proportion to the depth of depression of the button. The switch is capacitive-coupled for a switching operation and the snap feeling is given to the operator when the capacitance exceeds the given value.

16 Claims, 29 Drawing Figures

F I G. 17 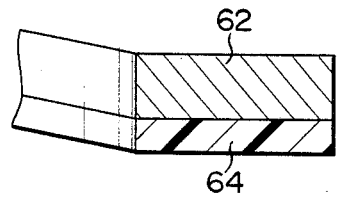
F I G. 18 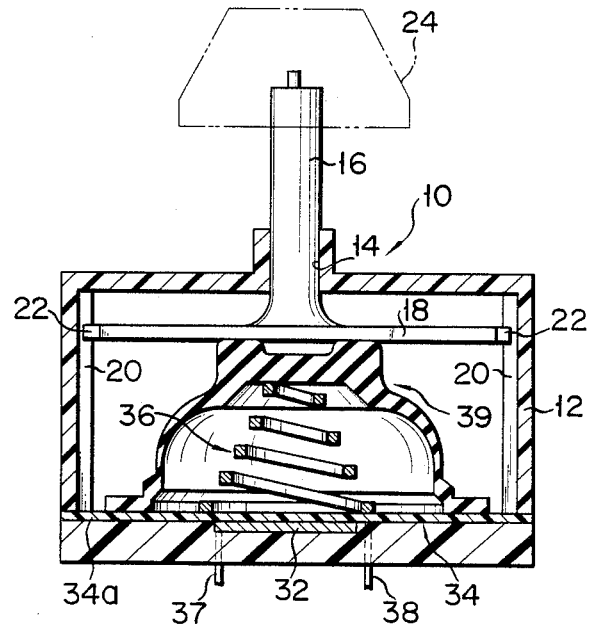
F I G. 19 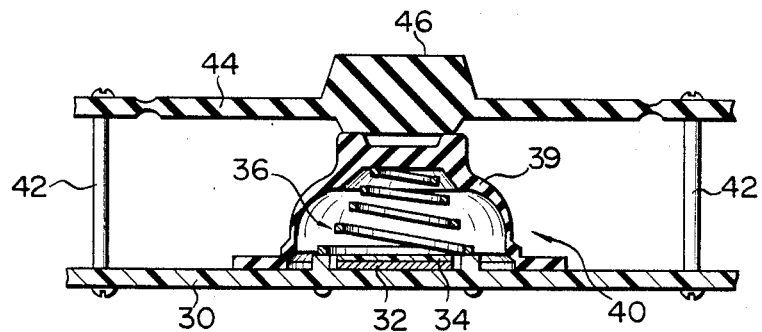

F I G. 24
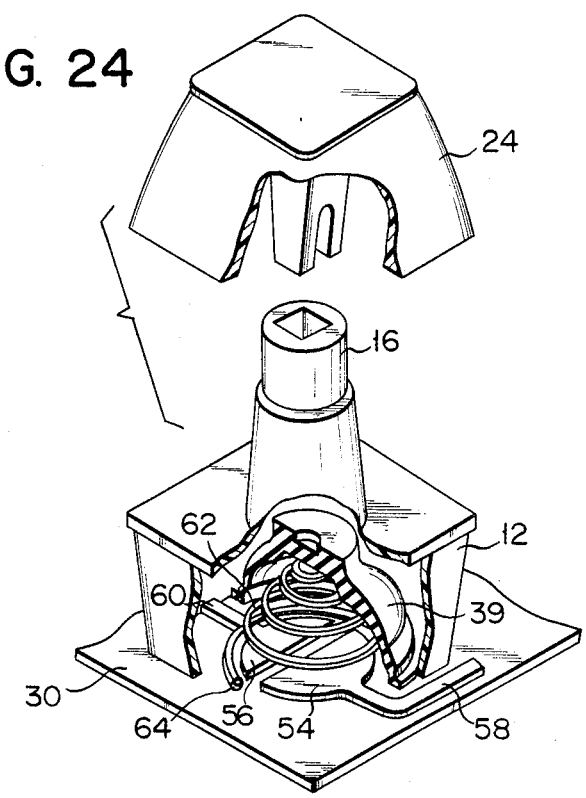
F I G. 25
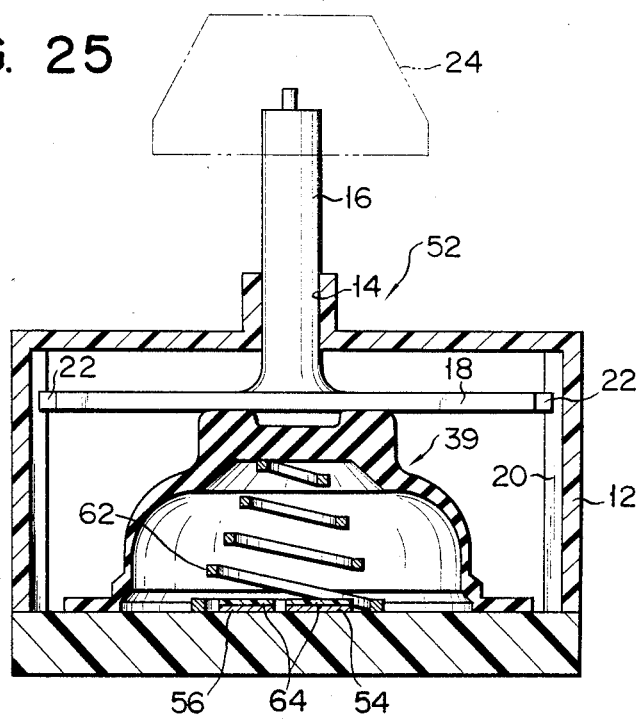

KEYBOARD SWITCH

BACKGROUND OF THE INVENTION

This invention relates to a keyboard switch of a non-contact type used for a keyboard, more specifically to a keyboard switch of a capacitive-coupling type.

In a capacitive-coupling type keyboard switch (hereinafter referred to as a capacitive switch), what is called a capacitor is generally provided with fixed and movable electrodes facing each other at a distance, with a dielectric disposed between them. The movable electrode is fitted with an operating member whereby the distance between the movable and fixed electrodes can be varied.

It is generally known that the capacitance of a capacitor is in inverse proportion to the distance between the electrodes and varies in proportion to the area of the facing portions of the electrodes where the voltage applied between the electrodes is constant. In the aforesaid conventional capacitive switch, the facing area is fixed, and the distance between the electrodes is variable. Accordingly, the capacitance of the capacitive switch varies with the change of the distance between the movable and fixed electrodes, and the capacitive switch performs a switching operation according to the variation of the capacitance. Thus, if the capacitance is higher than a given value, the switch is capacitive-coupled to allow a high-frequency component of AC current to flow. If the capacitance is lower than the given value, on the other hand, the switch is not capacitively coupled, and is turned off.

In the prior art capacitive switch, the relationship between the change of the depth of depression of the operating member and the change of the capacitance, which depends on the change of the distance between the electrodes, may be represented by a hyperbolic curve, as shown in FIG. 1. According to such a relationship, as is evident from FIG. 1, the changing rate of the capacitance is low when the depth of depression is small, and increases drastically when the depth of depression exceeds a given value. Thus, the setting range for the operating value of capacitance for the performance of switching operation is quite limited, so that it is very difficult to optionally set the operating value.

For example, if the operating value is set within a range where the rate of change of the capacitance responsive to the change of the depth of depression is high, no great hysteresis can be obtained, and it is hard to prevent an erroneous second depression of the key.

Namely, the depth of depression of the operating member for shifting the capacitive switch from OFF-state to ON-state (ON-operation depth of depression) and the ON-operation capacitance corresponding thereto are generally set greater than the depth of depression of the control member for shifting the capacitive switch from ON-state to OFF-state (OFF-operation depth of depression) and the OFF-operation capacitance corresponding thereto, respectively. The differences between the ON-operation depth of depression and the ON-operation capacitance corresponding thereto, and the OFF-operation depth of depression and the OFF-operation capacitance corresponding thereto constitute the aforesaid hysteresis. The aforesaid operating value is defined by the ON-operation capacitance.

Since the difference between the ON- and OFF-operation capacitances is normally set to be constant, the difference between the ON- and OFF-operation depths of depression will be reduced if the operating value for the capacitive switch is shifted as required to a range in which the rate of change of the capacitance responsive to the change of the depth of depression is high. Thus, if hysteresis is small, the capacitive switch will cause the second depression or repeated ON-OFF operations attributable to the normal movement of an operator's finger during depression, for example. As a result, where the capacitive switch is used in an input unit or an electric typewriter, over striking or other awkward effects can occur.

Inflammation of the tendon sheath has recently been occurring in the wrists of keyboard operators using keyboards as an input means for information equipment such as computers. Such an inflammation has become an occupational disease, thus provoking social concern. Inflammation of the tendon sheath may occur due to the following reason.

Conventionally, a capacitive switch is used as a keyboard switch. The capacitive switch is electrostatically connected when an electrostatic capacitance has reached a predetermined operation value, so that a high-frequency component of an AC current is rendered conductive. The operation value is set such that the switch is turned on when the switch is depressed halfway down. The operator need not depress the operation member to the lowest position at which the member is in contact with a corresponding electrode. However, since the operator is afraid of typing errors, he or she may depress the operation member until it abuts against the electrode. This is because the switch is completely turned on when the operation member abuts against the electrode and because the abutment between the impact of the operation member and the electrode can be felt by the operator. The impact acting on the finger of the operator upon abutment between the operation member and the electrode does not entail a forceful impact on the finger when such abutments are repeated several times. However, if the operator continues key input operation for a few hours, the impact accumulates. The total impact cannot be neglected and inflammation of the tendon sheath results.

SUMMARY OF THE INVENTION

The present invention has been made in consideration of the above situation, and has as its object to provide a keyboard switch wherein constant hysteresis can be obtained without changing the operation characteristics even if an operation value is arbitrarily set, thereby properly preventing chattering, and wherein an operator can know that the operation member has been depressed to a depth corresponding to the operation value.

According to one aspect of the present invention, there is provided a keyboard switch comprising an insulating substrate, a first electrode laid on the insulating substrate, a second electrode facing the first electrode, a dielectric disposed between the first and second electrodes, said second electrode being formed of a conical coil spring, and being positioned on the dielectric so that one end portion of the spring may be in contact with the surface of the dielectric, a capacitance between the first and second electrodes being mainly defined by the contact area between the dielectric and second electrode, a button on the other end portion of the second electrode for compressing the second electrode toward the first electrode to change the contact area when the button is depressed toward the first electrode, said capacitance varying with the change in the facing area which changes substantially in proportion to the depth of depression of the button, and a means for giving snap feeling to an operator when the button is depressed and the capacitance exceeds a given value, whereby the switch is capacitively coupled for a switching operation and the snap feeling is given to the operator when the capacitance exceeds the given value.

BRIEF DESCRIPTION OF THE DRAWINGS

FIG. 17 is an enlarged sectional view showing part of an auxiliary electrode used in the keyboard switch shown in FIG. 10;

FIG. 18 is a sectional view showing a first modification of the first embodiment;

FIG. 19 is a sectional view showing a modification of the second embodiment;

FIG. 24 is a perspective view showing a second modification of the fourth embodiment;

FIG. 25 is a sectional view showing a third modification of the fourth embodiment;

DETAILED DESCRIPTION OF THE PREFERRED EMBODIMENTS

Figure 1:
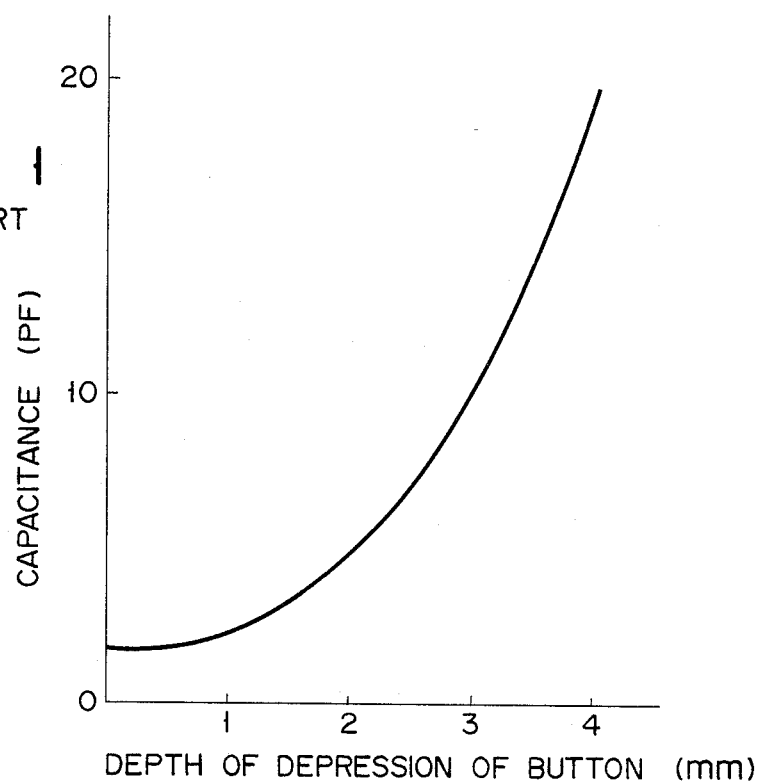
FIG. 1 is a diagram showing the relationship between the capacitance and the depth of depression of the button of a prior art switch.

Referring now to the drawings of FIGS. 2 to 9, there will be described a first embodiment of the keyboard switch according to this invention.

Figure 2:
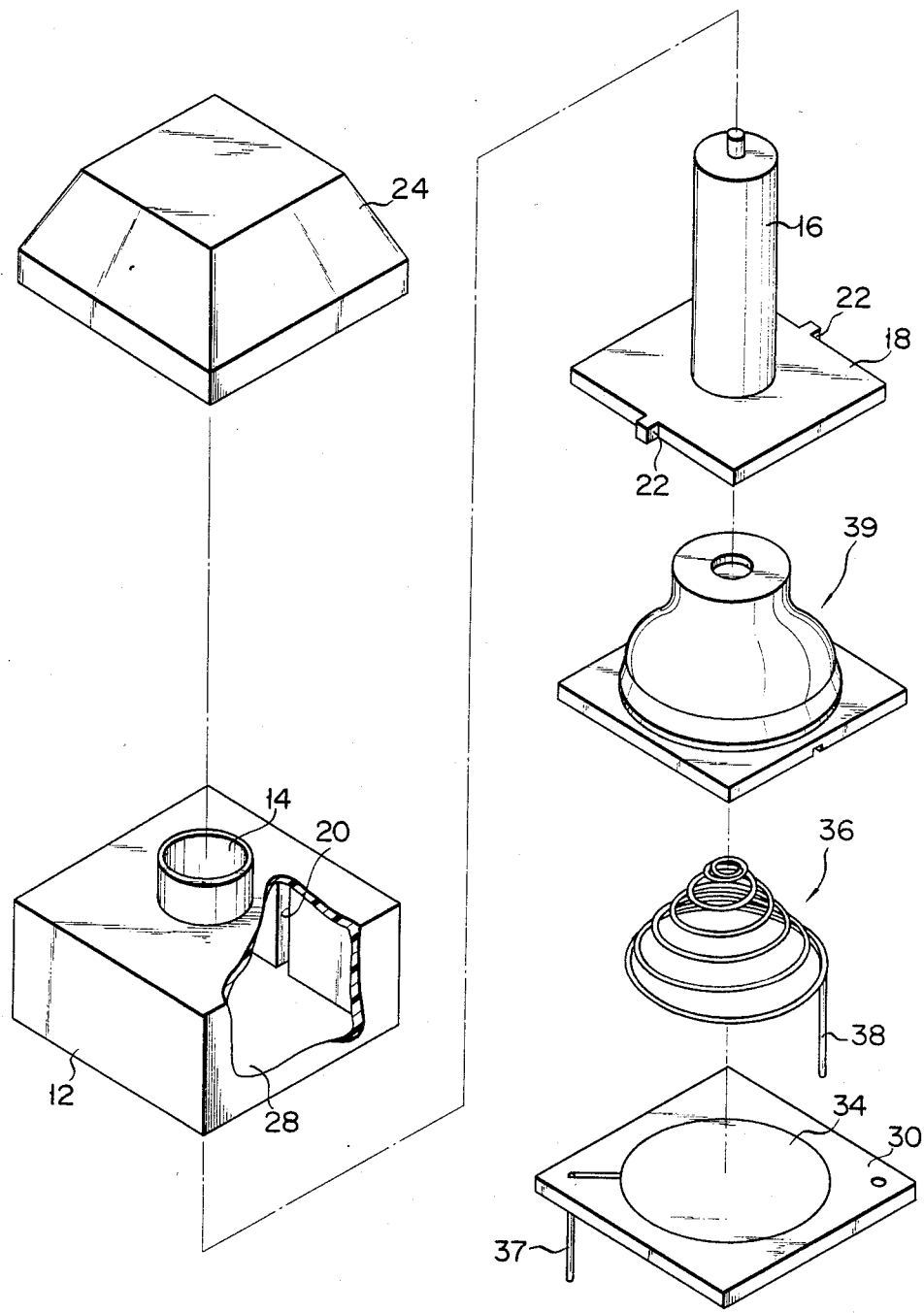
FIG. 2 is a disassembled perspective view showing a first embodiment of a keyboard switch according to this invention.

In FIG. 2, a keyboard switch or capacitive switch 10 is provided with a hollow, rectangular parallelepiped casing 12 formed of synthetic resin. A bore 14 is formed vertically extending through the central portion of the top plate of the casing 12. A stem 16 is inserted in the bore 14 so as to be able to slide vertically. The lower end of the stem 16 is located inside the casing 12, and is fitted integrally with a plate-like plunger 18. The outer perimeter of the plunger 18 is a little shorter than the inner perimeter of the casing 12. Guide grooves 20 are engraved vertically extending on the inner faces of a facing pair of side walls of the casing 12, respectively. A projection 22 is formed at a predetermined portion of a side of the plunger 18 to face each of the guide grooves 20 so as to be fitted in its corresponding guide groove 20. By the engagement between the guide grooves 20 and their corresponding projections 22, the plunger 18 is allowed to only reciprocate vertically without rotating. The upper end of the stem 16 is exposed outside the casing 12, and is removably fitted with a button 24.

Formed in the entire bottom of the casing 12 is a rectangular opening 28. A base member 30 is attached to the undersurface of the casing 12 so as to block the opening 28. The base member 30 is formed of an electric insulator, such as a synthetic resin. A fixed electrode 32 formed of a good electric conductor is disposed on the base member 30 so as to face the opening 28. The top surface of the fixed electrode 32 is substantially flush with the top surface of the base member 30. A dielectric 34 formed of a polyester film is spread over the top surfaces of the fixed electrode 32 and base member 30. A contractible electrode 36 is disposed on that portion 34a of the dielectric 34 which is spread over the top surface of the base member 30.

The contractible electrode 36 is a helical coil spring having a substantially conical shape. The lower and upper ends of the coil spring 36, having maximum and minimum coil diameters respectively, abut on the top surface of the dielectric portion 34a and the undersurface of the plunger 18, respectively. The plunger 18 is biased upward by the urging force of the contractible electrode 36. Formed of a spring material or a wire with a circular section, the contractible electrode 36 has electric conductivity. The spring material may be, for example, phosphor bronze or stainless steel. The contractible electrode 36 is so formed as to become a spiral when compressed. Namely, when compressed, the contractible electrode 36 becomes flat with its thickness made equal to the diameter of the coil spring wire as the spring material. The maximum coil diameter of the bottom portion of the contractible electrode 36 is greater than the diameter of the dielectric 34. Thus, the lowermost turn of the contractible electrode 36 is not in contact with the dielectric 34.

A rubber cap 39 as snap feeling giving means is placed on the base member 30 to cover the contractible electrode 36. In other words, the rubber cap 39 is arranged between the plunger 18 and the contractible electrode 36.

The rubber cap 39 has a base plate 39b having a circular hollow portion 39a at its center, an annular portion 39c extending upward from that portion of the base plate 39b which defines the hollow portion 39a, and a cap-like wall portion 39d extending from the annular portion 39c. Grooves 39f for exhausting air from the cap-like wall portion 39d are formed on the bottom surface of the base plate 39b. A thick abutment portion 39e parallel to the base plate 39b is formed in the vicinity of the top of the wall portion 39d. The thickness of the wall portion 39d is smallest in the vicinity of the annular portion 39c and is largest in the vicinity of the abutment portion 39e. The rubber cap 39 is made of EPT (ethylene-propylene-terpolymer).

Figure 5:
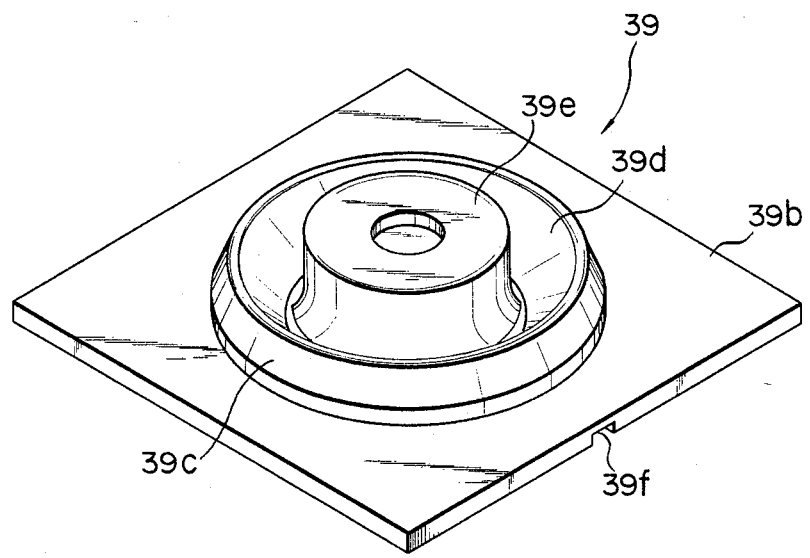
FIG. 5 is a perspective view showing the rubber cap when the cap is depressed.
Figure 6:
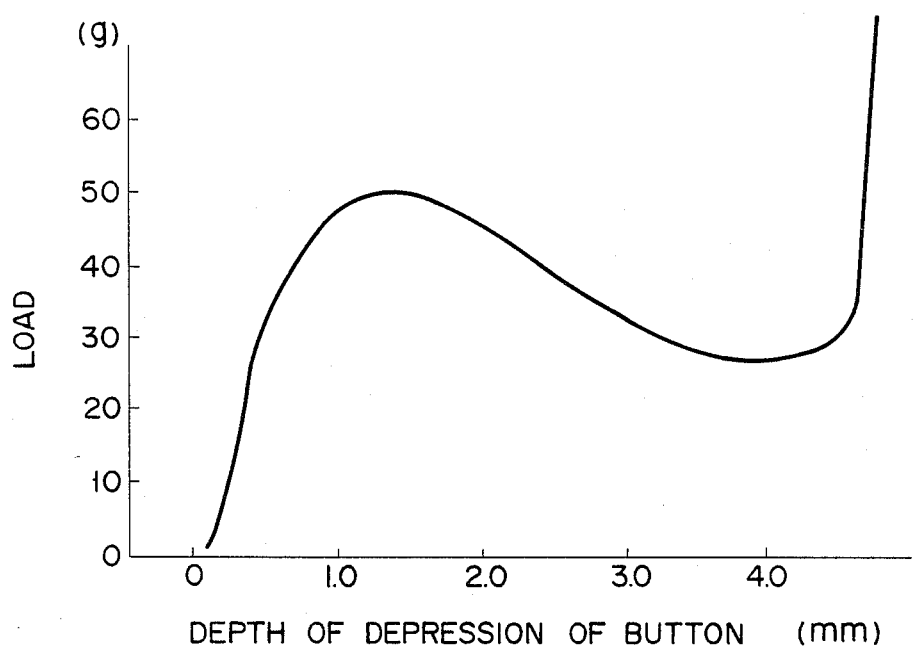
FIG. 6 is a diagram showing the relationship between the load to the button and the depth of depression of the button of the switch using the rubber cap shown in FIG. 3.

When the rubber cap 39 is depressed while the abutment portion 39e faces downward, the rubber cap 39 is deformed, as shown in FIG. 5. The relationship between the stroke and the load required for the stroke is illustrated in FIG. 6. At an initial portion (a depth of about 1 mm) of the stroke, the load is increased in proportion with the stroke. However, when the depth exceeds 1 mm, the load is decreased. The decrease in load required for depression is felt by the operator as a snap.

The snap phenomenon occurs since the thickness of the wall portion 39d of the rubber cap 39 is not uniform. In other words, when the rubber cap 39 is depressed to a certain depth, the wall portion 39d is folded at the thin portion of the wall portion 39d. When the wall portion 39d is folded, the load for depression is gradually decreased. Therefore, the snap feeding is given by the rubber cap 39 to the hands of the operator.

Figure 7:
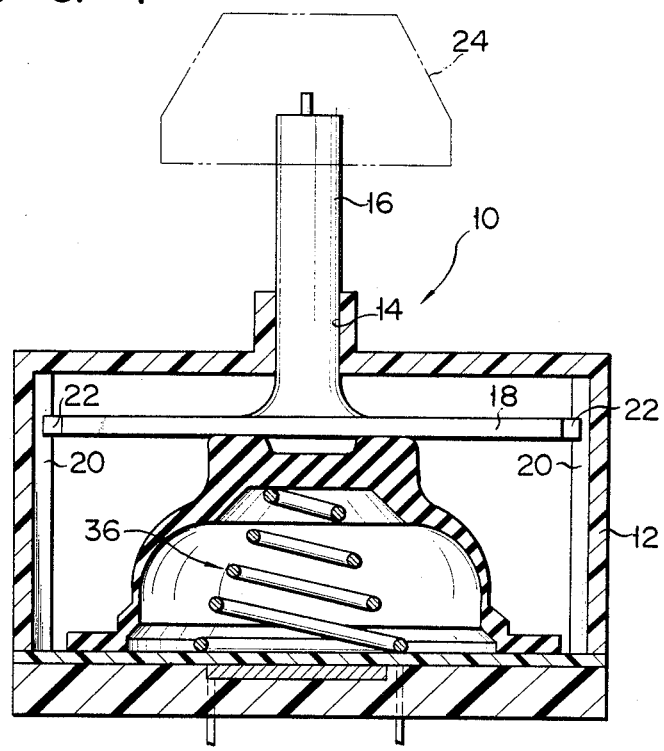
FIG. 7 is a sectional view of the switch shown in FIG. 2 in a first position.
Figure 8:
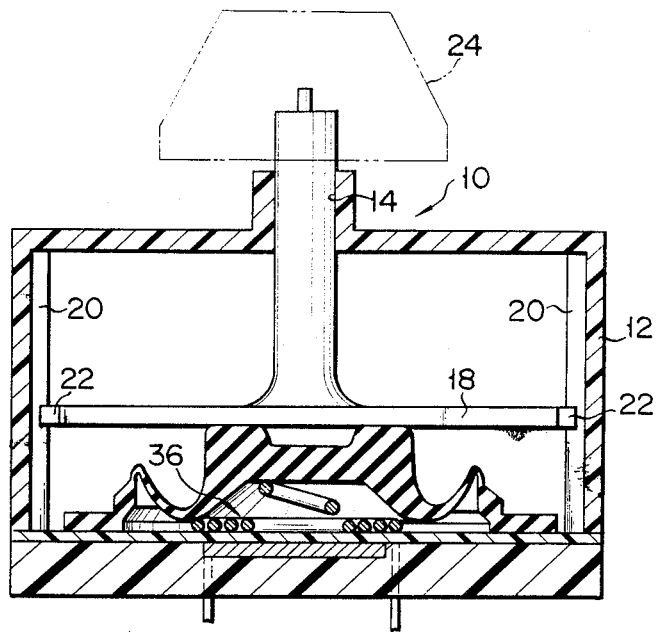
FIG. 8 is a sectional view of the switch shown in FIG. 2 in a second position.

When the button 24 is not subjected to any external force, the plunger 18 is biased upward by the contractible electrode 36, where it remains in a first position where it is projected outward over a given distance. In this first position, as shown in FIG. 7, the contractible electrode 36 is in contact only with the top surface of the dielectric portion 34a. When the button 24 is pressed down by a finger, on the other hand, the plunger 18 is biased downward against the urging force of the contractible electrode 36 and the rubber cap 39. At the same time, the button 24 is brought to a second position where it is slightly projected from the casing 12. In this second position, as shown in FIG. 8, the greater part of the contractible electrode 36 is in contact with the surface of the dielectric 34.

Hereupon, the fixed electrode 32 is connected with one end of a first terminal 37. The other end of the first terminal 37 penetrates the base member 30, and is exposed thereunder. On the other hand, the bottom portion of the contractible electrode 32 is connected with one end of a second terminal 38. The other end of the second terminal 38 penetrates the dielectric portion 34a and the base member 30, and is exposed thereunder. The terminals 37 and 38 are formed of an electrically conductive material.

Now there will be described the operation of the capacitive switch 10 having the above-mentioned construction.

An AC voltage at a given level from an AC power source (not shown) is applied between the fixed and contractible electrodes 32 and 36 via the first and second terminals 37 and 38. When the button 24 is in the first position shown in FIG. 7 where it is not depressed, no part of the contractible electrode 36 is in contact with the surface of the dielectric portion 34a. Further, the fixed electrode 32 and the turn portions of the contractible electrode 36 facing the fixed electrode 32 with the dielectric 34 between them are kept at given distances. Therefore, the capacitance defined between the electrodes 32 and 36 is as low as 1 (pF), for example.

Figure 9:
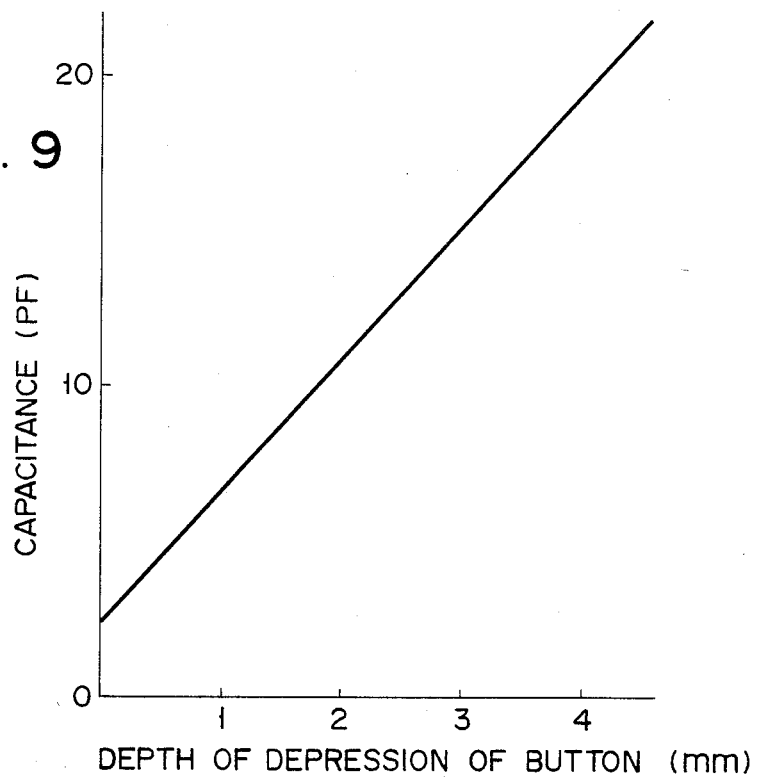
FIG. 9 is a diagram showing the relationship between the capacitance and the depth of depression of the button of the switch according to the first embodiment.

When the button 24 is depressed from the first position by a finger, the plunger 22 is pushed down against the urging force of the contractible electrode 36 and rubber cap 39. In response to the depression of the plunger 22, the contractible electrode 36 comes into contact with the surface of the dielectric 34, the lower turns going ahead of the upper ones. This is done because a turn portion with a greater coil diameter is subjected to greater twisting moment and hence to heavier deformation. In a no-load state, the conical spring constituting the contractible electrode 36 is reduced in diameter in proportion to its height. Accordingly, the area of the contractible electrode 36 in contact with the surface of the dielectric 34 increases substantially in proportion to the increase of the depth of depression of the button 24. Thereupon, as is generally known, the capacitance C of a capacitor is defined as follows:

$$C = \epsilon S/d$$

where d is the distance between the electrodes 32 and 36, S is the area of the facing portions of the electrodes 32 and 36, and $\epsilon$ is the dielectric constant of the dielectric 34. Since $\epsilon$ is regarded as constant and the variation of d is substantially negligible, the capacitance obtained between the electrodes 32 and 36 depends on S. Namely, this capacitance varies substantially in proportion to the depth of depression of the button 24, as shown in FIG. 9.

When the button 24 is in the second position as shown in FIG. 8 where the contractible electrode 36 is crushed substantially flat by the plunger 18, the capacitance obtained between the electrodes 32 and 36 is 22 (pF), for example.

Hereupon, the set value of the capacitance for the switching operation is adjusted to 12 (pF) so that the switch may be turned on with half the full depth of depression of the button 24. As for the capacitance value for OFF-operation, it is set to 8 (pF) which is 4 (pF) lower than the set value for the ON-operation. Thus, the capacitive switch 10 is turned on when the button 24 is pushed from the position shown in FIG. 7 to reach half of the full depth of depression. Namely, the capacitive switch 10 is capacitive-coupled to allow a high-frequency current to flow. This conducting state may be maintained even after the button 24 is further depressed to increase the capacitance. When the finger is then removed from the button 24, the plunger 18 is pushed up by the urging force of the contractible electrode 36. The capacitive switch 10 is turned off when the plunger 18 reaches a position where the depth of depression of the button 24 is a little narrower than half the full depth. Thus, the capacitive switch 10 is released from the capacitive coupling to be insulated.

In the aforementioned capacitive switch 10, the contractible electrode 36 is formed of the conical coil spring, and the facing area between the electrodes 32 and 36 is changed by compressing the coil spring by means of the plunger. Hereupon, the facing area changes substantially in direct proportion to the depth of depression of the plunger 18 or the button 24. Accordingly, the characteristic curve for the capacitance varying according to such facing area is substantially linear, as shown in FIG. 9. Thus, the set value for the ON-operation can take any suitable or optional value.

As a result, even if the ON-operation value is varied optionally with a fixed difference between the ON- and OFF-operation values for hysteresis, the depth of depression corresponding to the difference between the ON- and OFF-operation will never change, and constant hysteresis can be maintained. Thus, it is not feared that the depth of depression of the button between the positions for the OFF- and ON-operations will be reduced causing an erroneous second time depression of the button by setting the operating value within a range where the rate of change of the capacitance responsive to the change of the depth of depression is high, as in the case of the prior art switch.

Since the contractible electrode 36 is formed of a conical coil spring, moreover, the button 24, when released from the depression, is returned to the first position through the urging force of the contractible electrode 36. Accordingly, there is no need of a return spring for the operating member. Thus, the number of components is reduced, and the construction is simplified to ensure low manufacturing cost.

The impact to the fingers is given in the following manner when the operator depresses the capacitive switch 10. The rubber cap 39 is arranged between the plunger 18 and the contractible electrode 36. The rubber cap 39 presents a relationship between the depth of depression of the button 24 and the load, as shown in FIG. 6. The operator feels a light key touch when the operator depresses the button 24 to a depth (corresponding to half of the full depression depth so as to produce a capacitance of 12 pF as an operation value) between about 1 mm and 2 mm. In other words, the operator feels a snap feeling when the button 24 is depressed to a depth corresponding to the operation value.

Although the operator does not depress the button 24 to the lowest position, the operator can feel, as a snap feeling, that the switch 10 has been turned on. Therefore, the operator will not receive the impact, thereby decreasing the possibility of inflammation of a tendon sheath.

A plurality of such capacitive switches or keyboard switches 10 may be arranged on a panel to constitute a keyboard.

This invention is not limited to the above-mentioned first embodiment, and various changes and modifications may be effected therein by one skilled in the art without departing from the scope or spirit of the invention. In the description of various other embodiments to follow, like reference numerals refer to like portions.

Figure 10:
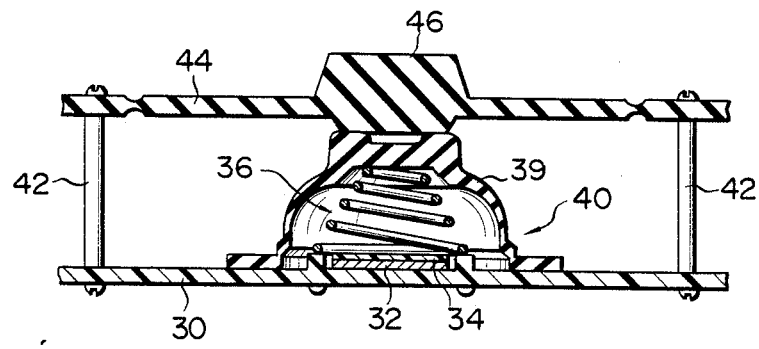
FIG. 10 is a sectional view showing a second embodiment of the keyboard switch according to the invention in the first position.
Figure 11:
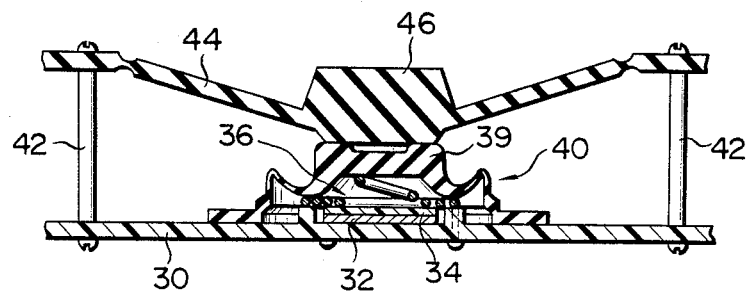
FIG. 11 is a sectional view of the keyboard switch shown in FIG. 6 in the second position.

FIGS. 10 and 11 show a second embodiment of the keyboard switch according to the invention. In this second embodiment, no casing is used. Namely, a capacitive switch 40 of the second embodiment comprises a printed substrate 30 as a base member, a fixed electrode 32 fixed directly on the surface of the printed substrate 30, a dielectric 34 attached to the surface of the fixed electrode 32, an elastic plate 44 as a cover member disposed over and in parallel with the printed substrate 30 with a plurality of spacers 42 between them, a button 46 mounted on that portion of the elastic plate 44 right over the fixed electrode 32, a contractible electrode 36 formed of a conical coil spring and disposed on the dielectric 34 and rubber cap 39 disposed between the button 46 and electrode 36. The button 46 may be formed integrally by thickening part of the elastic plate 44.

When subjected to no external force, the button 46 is maintained in the first position (FIG. 10) as mentioned in connection with the first embodiment by the elasticity of the elastic plate 44, the rubber cap 39 and the contractible electrode 36. When the button 46 is pressed down against such elasticity to be brought to the second position as shown in FIG. 11, the capacitive switch 40 is capacitive-coupled and turned on, giving a snap feeling to the operator. Thus, according to the second embodiment, the same effect of the first embodiment may be obtained without using the casing, and the trouble of manufacturing the keyboard can greatly be reduced. Moreover, the switch 40 can be thinned.

Figure 12:
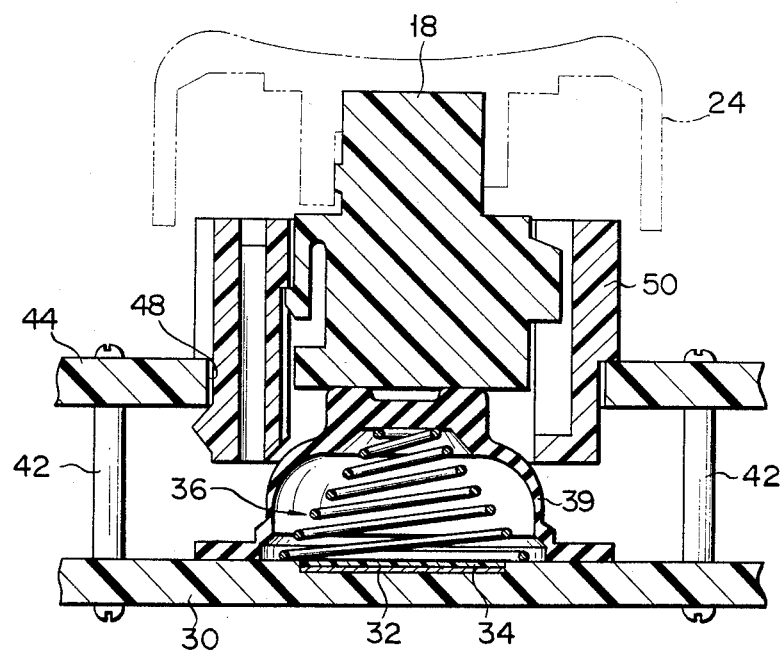
FIG. 12 is a sectional view showing a third embodiment of the keyboard switch according to the invention in the first position.
Figure 13:
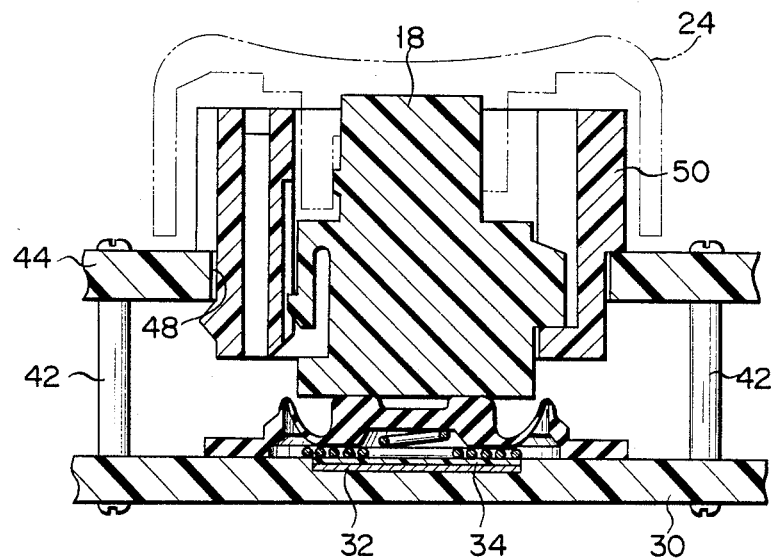
FIG. 13 is a sectional view of the keyboard switch shown in FIG. 8 in the second position.
Figure 14:
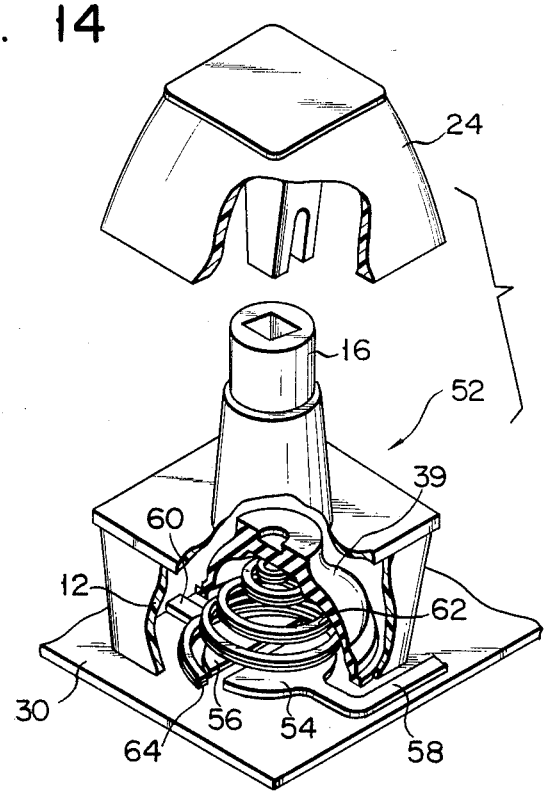
FIG. 14 is a partially broken away, perspective view showing a fourth embodiment of the keyboard switch according to the invention.

FIGS. 12 and 13 show a third embodiment of the keyboard switch according to the invention. In this third embodiment, like in the second embodiment, no casing is used. The third embodiment differs from the second embodiment in that the cover member is formed not of elastic material but of rigid synthetic resin. In the third embodiment, a bore 48 is formed in that portion of a cover member 44 which is located right over a fixed electrode 32, and a guide member 50 formed of a hollow pillar-like structure with a rectangular section is fixedly inserted in the bore 48. A plunger 18 is held in the guide member 50 so as to be able to move vertically between the first position shown in FIG. 12 and the second position shown in FIG. 13. A contractible electrode 36 formed of a conical coil spring is disposed on the dielectric 34. A rubber cap 39 is positioned between the plunger 18 and contractible electrode 36.

Thus, according to the third embodiment, the same effect of the second embodiment may be obtained.

In the second and third embodiments, the respective terminals of the fixed and contractible electrodes 32 and 36 may be led out over or under the printed substrate 30.

FIGS. 14 to 17 show a fourth embodiment according to the invention. In this fourth embodiment, a capacitive switch 52 includes a pair of fixed electrodes 54 and 56 fixed on a base member 30 so as to face each other at a given distance. The respective terminals 58 and 60 of the fixed electrodes 54 and 56 are led out on the base member 30. The fixed electrodes 54 and 56 are each formed of a substantially semicircular sheet, with their chord portions facing each other. An auxiliary electrode 62 is put on a region defined by the two fixed electrodes 54 and 56. Having the same construction as the contractible electrode 36 described in connection with the first embodiment, the auxiliary electrode 62 is formed of a conical coil spring whose element wire has a rectangular section. As shown in detail in FIG. 17, a dielectric 64 overspreads the underside of the element wire forming the coil spring of the auxiliary electrode 62, that is, the surface to face the fixed electrodes 54 and 56. A rubber cap 39 is disposed between the plunger 18 and auxiliary electrode 62.

Figure 15:
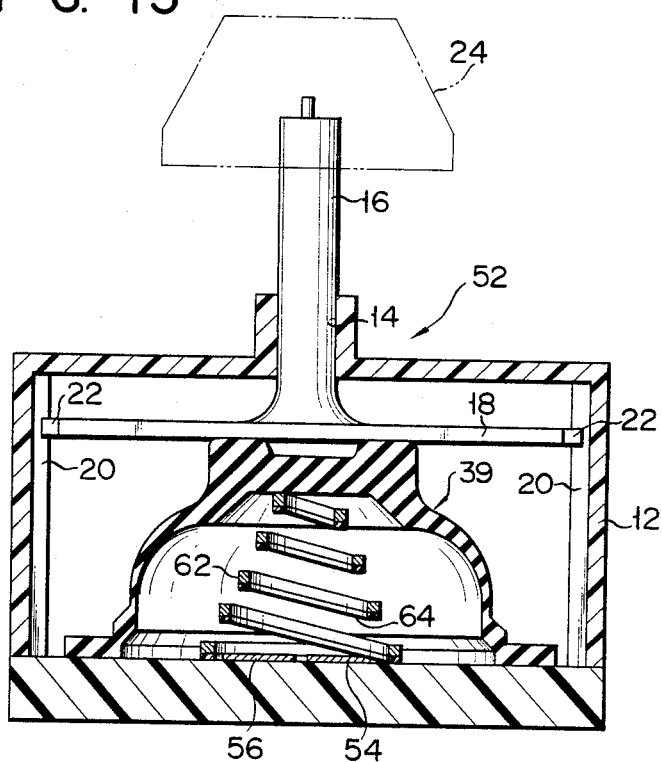
FIG. 15 is a sectional view of the keyboard switch shown in FIG. 10 in the first position.
Figure 16:
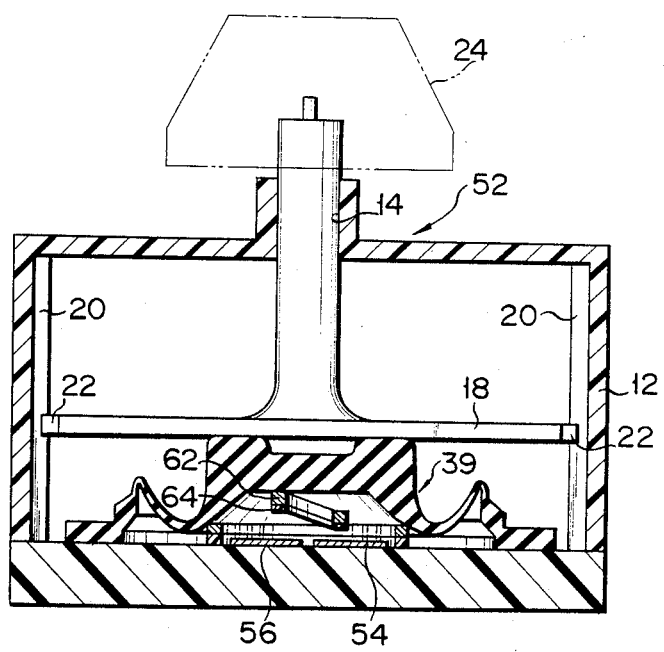
FIG. 16 is a sectional view of the keyboard switch shown in FIG. 10 in the second position.

In the fourth embodiment constructed in this manner, the facing area between the two fixed electrodes 54 and 56 facing each other with the dielectric 64 between them in the first position as shown in FIG. 15 is narrow. Therefore, the capacitance obtained between these electrodes 54 and 56 is low. When a button 24 is depressed from the first position by a finger, the auxiliary electrode 62 comes into contact with the fixed electrodes 54 and 56 by means of the dielectric 64 according to the depth of depression of the button 24, with the lowermost turn touching the fixed electrodes 54 and 56 first. Accordingly, the aforesaid facing area changes substantially in proportion to the depth of depression of the button 24. Namely, the capacitance obtained between the electrodes 54 and 56 changes in a like manner. The maximum capacitance can be obtained in the second position as shown in FIG. 16. Thus, the same switching operation as in the first embodiment may be effected. Since the contact portions between the dielectric 64 and the fixed electrodes 54 and 56 are flat, the contact area is much wider than the contact areas obtained in the aforementioned first to third embodiments. Thus, the difference between the capacitances obtained when the button is in the first and second positions is increased to ensure a wider setting range for the operating values and greater hysteresis. Also, the rubber cap 39 of the capacitive switch 52 gives a snap feeling to the operator.

Figure 20:
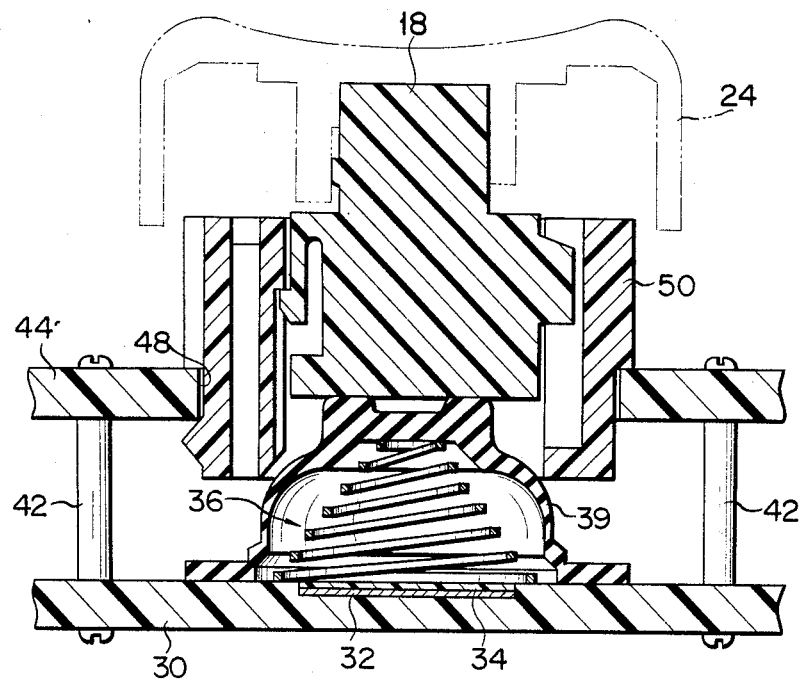
FIG. 20 is a sectional view showing a modification of the third embodiment.

In the above-mentioned first to third embodiments, the element wire of the conical coil spring used as the contractible electrode has been explained as having a circular section. This invention is not, however, limited to such a precise configuration, and a conical coil spring formed of a rectangular section wire may be used for the contractible electrode 36, as shown in FIGS. 18 to 20 as respective modifications of the first to third embodiments. Hereupon, the contact area may be greatly increased to ensure the same effect of the fourth embodiment by setting the conical coil spring so that the bottom side of the element wire may face the fixed electrodes 54 and 56 in parallel thereto.

Figure 21:
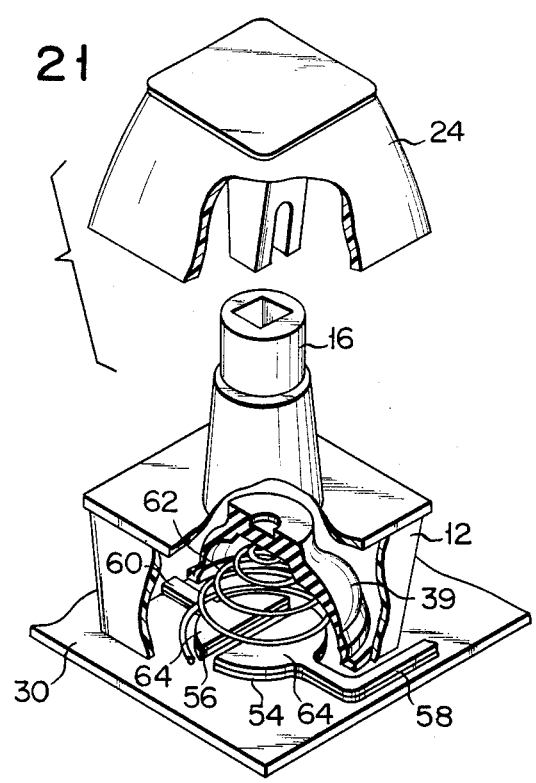
FIG. 21 is a perspective view showing a first modification of the fourth embodiment.
Figure 22:
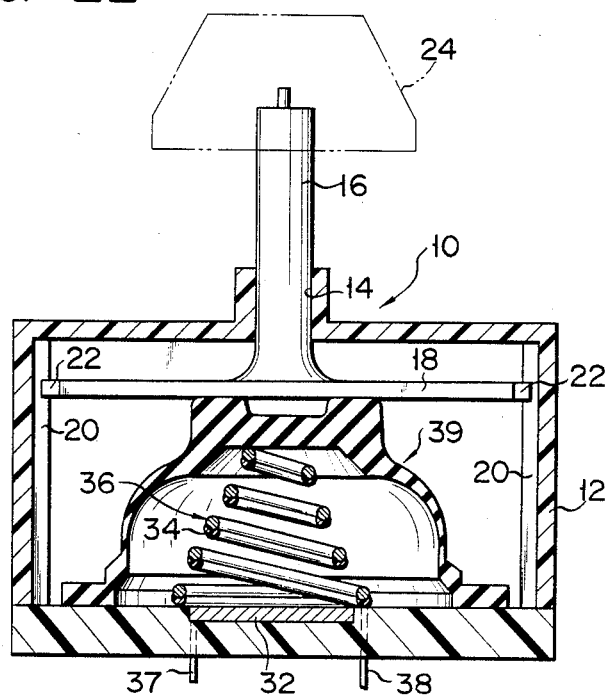
FIG. 22 is a sectional view showing a second modification of the first embodiment.
Figure 23:
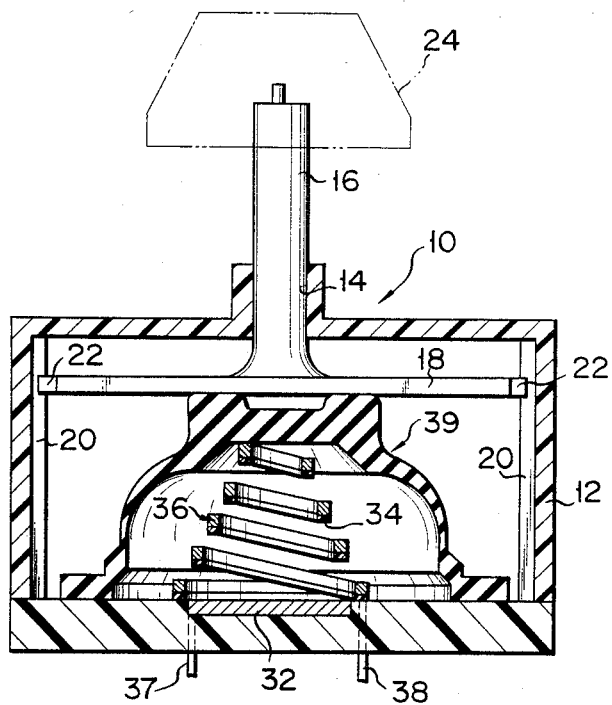
FIG. 23 is a sectional view showing a third modification of the first embodiment.

Further, as shown in FIG. 21 as a first modification of the fourth embodiment, the element wire of the coil spring 62 may have a circular section, and a dielectric 64 may be attached to the upper sides of the two fixed electrodes 54 and 56. Still further, as shown in FIG. 22 as a second modification of the first embodiment, the element wire of the coil spring 36 may have a circular section, and the dielectric 34 may be attached to the bottom surface of the coil spring 36. As shown in FIG. 23 as a third modification of the first embodiment, the element wire of the coil spring 36 may have a rectangular section, and a dielectric 34 may be attached to the bottom surface of the coil spring 36. As shown in FIG. 24 as a second modification of the fourth embodiment, the element wire of the coil spring 62 may have a circular section and a dielectric 64 may be attached to the undersurface of the coil spring 62. And as shown in FIG. 25 as a third modification of the fourth embodiment, the element wire of the coil spring 62 may have a rectangular section, and a dielectric 64 may be attached to the upper sides of the two fixed electrodes 54 and 56.

Figure 3:
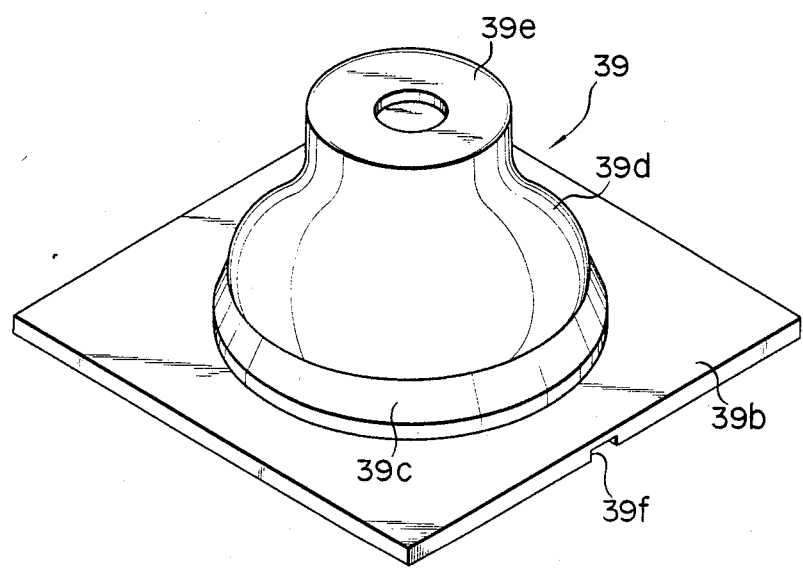
FIG. 3 is a perspective view showing a rubber cap used in the switch shown in FIG. 2.
Figure 4:
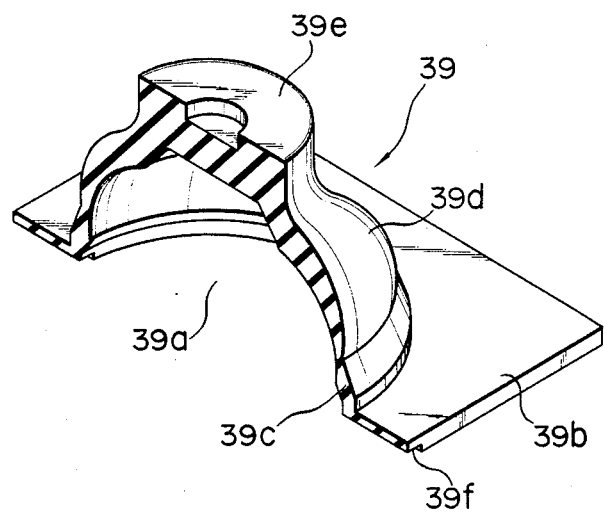
FIG. 4 is a broken away perspective view showing the rubber cap.

In the embodiment and modification described above, the feeling giving means comprises the rubber cap 39 shown in FIGS. 3 and 4. However, this feeling giving means may be any elastic cap which is disposed separately from a conical coil spring and which has a wall portion of a nonuniform thickness.

Figure 26:
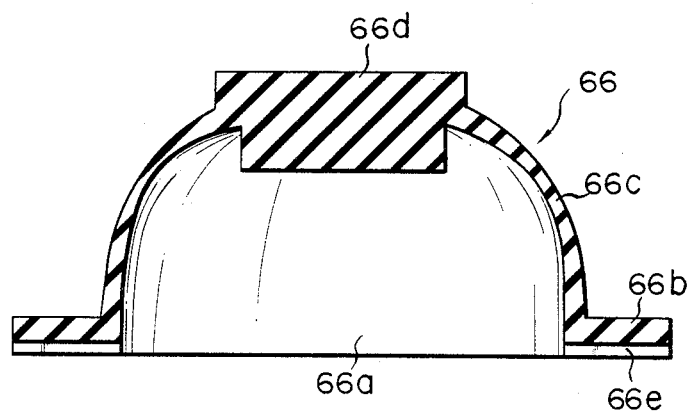
FIG. 26 is a sectional view showing a rubber cap of a first modification.
Figure 27:
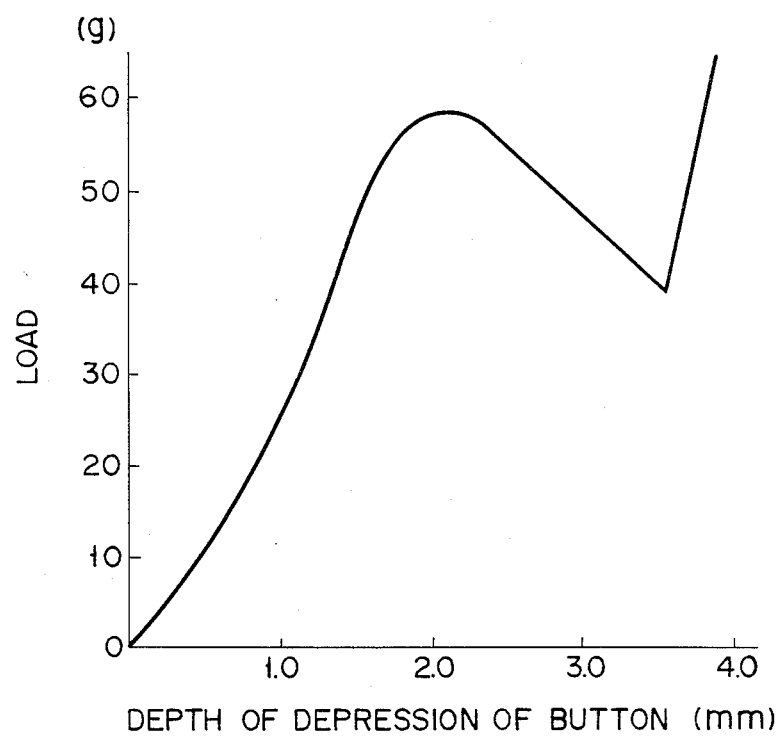
FIG. 27 is a diagram showing the relationship between the load to the button and the depth of depression of the button of the switch using the rubber cap of the first modification shown in FIG. 26.

FIG. 26 shows a first modification of the rubber cap. A rubber cap 66 in FIG. 26 has a base plate 66b having a circular hollow portion 66a at its center, and a cap-like wall portion 66c continuously formed with a portion of the base plate 66b which defines the hollow portion 66a. Grooves 66e for exhausting air from the wall portion 66c are formed on the bottom surface of the base plate 66b. A thick abutment portion 66d parallel to the base plate 66b is formed at the top of the wall portion 66c. The thickness of the wall portion 66c is largest in the vicinity of the base plate 66b and is smallest in the vicinity of the abutment portion 66d. This rubber cap 66 provides a relationship between the depth of depression of button and the load, as shown in FIG. 27. Therefore, the rubber cap 66 can serve as a snap feeling giving means.

Figure 28:
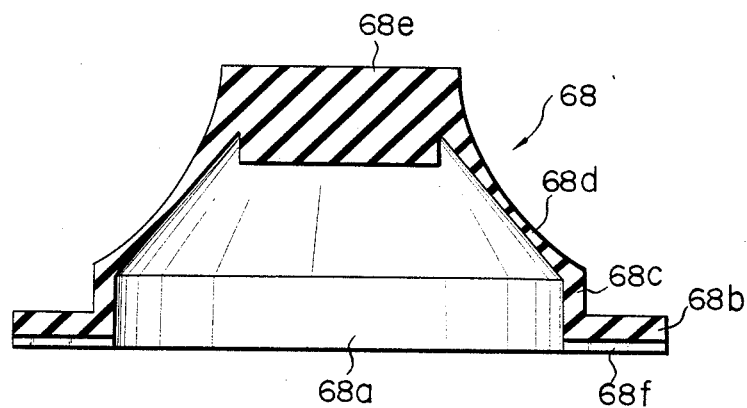
FIG. 28 is a sectional view showing a rubber cap of a second modification.
Figure 29:
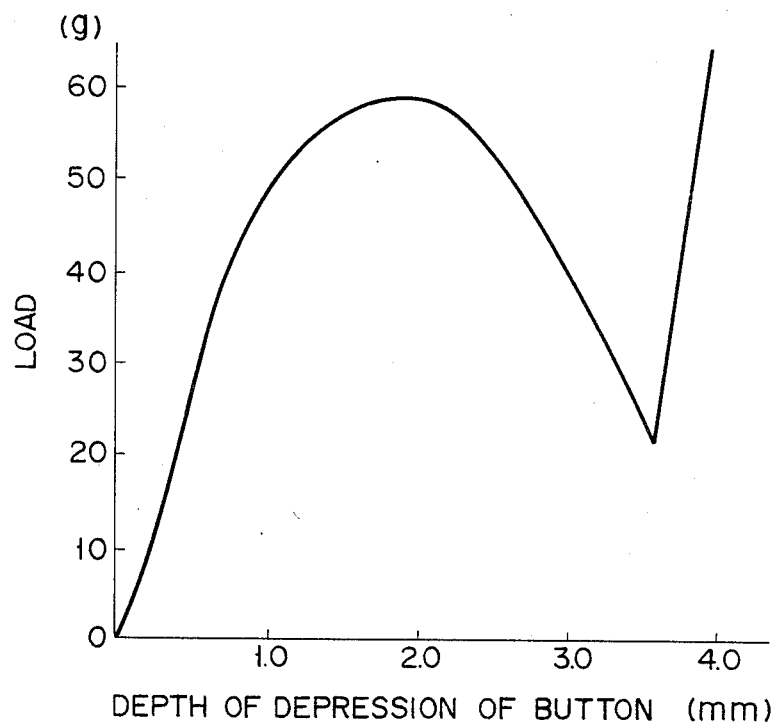
FIG. 29 is a diagram showing the relationship between the load to the button and the depth of depression of the button of the switch using the rubber cap of the second modification shown in FIG. 28.

FIG. 28 shows a second modification of the rubber cap. A rubber cap 68 in FIG. 28 comprises a base plate 68b having a circular hollow portion 68a at its center, an annular portion 68c extending upward from a that portion of the base plate 68b which defines the hollow portion 68a, and a substantially conical wall portion 68d obliquely extending from the annular portion 68c. Grooves 68f for exhausting air from the wall portion 68d are formed on the bottom surface of the base plate 68b. A thick abutment portion 68e parallel to the base plate 68b is formed at the top of the wall portion 68d. The thickness of the wall portion 68d is largest in the vicinity of the annular portion 68c and is smallest in an intermediate portion of the wall portion 68d. The rubber cap 68 provides a relationship between the depth of depression of the button and the load, as shown in FIG. 29. Therefore, the rubber cap 68 serves as a snap feeling giving means.

What is claimed is:

1. A keyboard switch comprising:
an insulating substrate;
a first electrode laid on the insulating substrate;
a second electrode facing the first electrode;
a dielectric positioned between the first and second electrodes,
said second electrode being formed of a conical coil spring, and being positioned on the dielectric such that one end portion of the spring may be contacted with the surface of the dielectric, capacitance between the first and second electrodes being mainly defined by the contact area between the dielectric and second electrode;
a button, positioned on the other end portion of the second electrode, for compressing the second electrode toward the first electrode to change the contact area when the button depressed toward the first electrode, said capacitance varying with the change in the facing area which changes substantially in proportion to the depth of depression of the button;
means for restoring said button to an undepressed position, said means for restoring comprising said second electrode; and
means for giving snap feeling to an operator when the button is depressed sufficiently that the capacitance exceeds a given value sufficient to activate said switch,
whereby the switch is capacitive-coupled for switching operation and the feeling is given to the operator when the capacitance exceeds the given value.

2. The keyboard switch according to claim 1, wherein said means for giving snap feeling include an elastic cap provided between the second electrode and button, and whereby said elastic cap is deformed to give the snap feeling to the operator when the button is depressed and the capacitance exceeds the given value.

3. The keyboard switch according to claim 2, wherein said elastic cap is formed of a rubber.

4. The keyboard switch according to claim 2, wherein said elastic cap includes a base member with an opening which opposes the first electrode, and a dome-shaped member attached to the base member to close the opening.

5. The keyboard switch according to claim 4, wherein said dome-shaped member has a thickness which is uneven in places.

6. The keyboard switch according to claim 5, wherein said dome-shaped member has a thin annular portion on the base member side and a thick annular portion on the top side.

7. The keyboard switch according to claim 5, wherein said dome-shaped member has a thick annular portion on the base member side and a thin annular portion on the top side.

8. The keyboard switch according to claim 7, wherein said dome-shaped member has a thick portion at the top thereof.

9. A keyboard switch comprising:

an insulating substrate;

a first electrode having one side and fixed on the insulating substrate;

a second electrode having one side and fixed on the same plane with the first electrode on the insulating substrate, said one sides of the first and second electrodes facing each other;

an auxiliary electrode formed of a conical coil spring, one end portion of the auxiliary electrode being mounted on the first and second electrodes;

a dielectric positioned between the first and second electrodes and the auxiliary electrode, the capacitance of the keyboard switch being mainly defined by contact area between the dielectric and auxiliary electrode;

a button, positioned on the other end portion of the auxiliary electrode, for compressing the auxiliary electrode toward the insulating substrate to change the contact area when the button is depressed toward the insulating substrate, said capacitance varying with the change in the facing area which changes substantially in proportion to the depth of depression of the button;

means for restoring said button to an undepressed position, said means for restoring comprising said auxiliary electrode; and means for giving snap feeling to an operator when the button is depressed sufficiently that the capacitance exceeds a given value sufficient to activate said switch whereby the switch is capacitive-coupled for a switching operation and the snap feeling is given to the operator when the capacitance exceeds the given value.

10. The keyboard switch according to claim 9, wherein said means for giving snap feeling include an elastic cap provided between the second electrode and button, whereby said elastic cap is deformed to give the snap feeling to the operator when the button is depressed and the capacitance exceeds the given value.

11. The keyboard switch according to claim 10, wherein said elastic cap is formed of a rubber.

12. The keyboard switch according to claim 10, wherein said elastic cap includes a base member with an opening which opposes the first electrode, and a dome-shaped member attached to the base member to close the opening.

13. The keyboard switch according to claim 12, wherein said dome-shaped member has a thickness which is uneven in places.

14. The keyboard switch according to claim 13, wherein said dome-shaped member has a thin annular portion on the base member side and a thick annular portion on the top side.

15. The keyboard switch according to claim 13, wherein said dome-shaped member has a thick annular portion on the base member side and a thin annular poriton on the top side.

16. The keyboard switch according to claim 15, wherein said dome-shaped member has a thick portion at the top thereof.

* * * * *